United States Patent
Mao et al.

(10) Patent No.: US 9,673,299 B2
(45) Date of Patent: Jun. 6, 2017

(54) METHOD FOR MANUFACTURING SPLIT-GATE POWER DEVICE

(71) Applicant: SU ZHOU ORIENTAL SEMICONDUCTOR CO., LTD., Jiangsu (CN)

(72) Inventors: Zhendong Mao, Jiangsu (CN); Lei Liu, Jiangsu (CN); Wei Liu, Jiangsu (CN); Minzhi Lin, Jiangsu (CN)

(73) Assignee: SU ZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 15/307,341

(22) PCT Filed: Mar. 15, 2016

(86) PCT No.: PCT/CN2016/076432
§ 371 (c)(1),
(2) Date: Oct. 27, 2016

(87) PCT Pub. No.: WO2016/165516
PCT Pub. Date: Oct. 20, 2016

(65) Prior Publication Data
US 2017/0062586 A1  Mar. 2, 2017

(30) Foreign Application Priority Data

Apr. 17, 2015 (CN) .......................... 2015 1 0182461
Jun. 12, 2015 (CN) .......................... 2015 1 0323899

(51) Int. Cl.
*H01L 21/336* (2006.01)
*H01L 29/66* (2006.01)
(Continued)

(52) U.S. Cl.
CPC .. *H01L 29/66666* (2013.01); *H01L 21/26513* (2013.01); *H01L 21/28* (2013.01);
(Continued)

(58) Field of Classification Search
None
See application file for complete search history.

(56) References Cited

U.S. PATENT DOCUMENTS

| 5,012,308 | A | 4/1991 | Hieda |
| 2003/0080378 | A1 | 5/2003 | Zundel et al. |

FOREIGN PATENT DOCUMENTS

| CN | 101714529 A | 5/2010 |
| CN | 103681850 A | 3/2014 |

(Continued)

OTHER PUBLICATIONS

ISA/CN, International Search Report issued in PCT/CN2016/076432, mailed on Jun. 20, 2016, total 6 pages with English translation.

*Primary Examiner* — Calvin Choi
(74) *Attorney, Agent, or Firm* — Masuvalley & Partners

(57) ABSTRACT

The present invention relates to the field of manufacturing technologies of semiconductor power devices, and more particularly to a method for manufacturing a split-gate power device. In the method for manufacturing a split-gate power device according to the present invention, lateral etching is added to form lateral recesses of a control gate groove below a first insulating film in a process of forming the control gate groove by etching, and therefore, after a first conductive film is deposited, the first conductive film can be directly etched by using the first insulating film as a mask to form control gates. The technical process of the present invention is simplified, reliable and easy to control, and can greatly improve the yield of the split-gate power device. The (Continued)

present invention is particularly suitable for the manufacture of 25V-200V semiconductor power devices.

18 Claims, 9 Drawing Sheets

(51) Int. Cl.
*H01L 21/28* (2006.01)
*H01L 29/423* (2006.01)
*H01L 29/78* (2006.01)
*H01L 21/265* (2006.01)
*H01L 21/311* (2006.01)
*H01L 23/00* (2006.01)

(52) U.S. Cl.
CPC .. *H01L 21/31105* (2013.01); *H01L 21/31144* (2013.01); *H01L 23/562* (2013.01); *H01L 29/423* (2013.01); *H01L 29/4236* (2013.01); *H01L 29/78* (2013.01)

(56) References Cited

FOREIGN PATENT DOCUMENTS

| | | |
|---|---|---|
| CN | 104916544 A | 9/2015 |
| CN | 104952718 A | 9/2015 |
| JP | 5221976 B2 | 6/2013 | the material of the sixth insulating film is silicon oxide; and the material of the metal layer is an aluminum alloy.

METHOD FOR MANUFACTURING SPLIT-GATE POWER DEVICE

RELATED APPLICATIONS

This application is the U.S. National Phase application under 35 U.S.C. §371 of International Patent Application No. PCT/CN2016/076432, filed Mar. 15, 2016, entitled "METHOD FOR MANUFACTURING SPLIT-GATE POWER DEVICE," which claims priority to Chinese Patent Application No. 201510182461.X, filed Apr. 17, 2015 and Chinese Patent Application No.201510323899.5, filed Jun 12, 2015, which are hereby expressly incorporated by reference in their entirety for all purposes.

BACKGROUND OF THE INVENTION

Field of the Invention

The present invention relates to the field of manufacturing technologies of semiconductor power devices, and more particularly to a method for manufacturing a split-gate power device.

Description of Related Art

With the continuous development of microelectronics technologies, semiconductor power devices are gradually replacing bipolar devices to become the mainstream of development of current power devices, for advantages such as high input impedance, low loss, fast switching speed, no secondary breakdown, wide safe operating area, good dynamic performance, being easy to be coupled to a front pole to achieve a large current, and high conversion efficiency. A split-gate power device can reduce parasitic capacitance between a control gate and a drain region, decrease the dynamic power consumption of a device and increase the switching speed, and has become a preferred structure of a semiconductor power device. An existing typical method for manufacturing a split-gate power device includes: forming a control gate groove in a substrate epitaxial layer 100, and forming a control gate 105 at two sides of the control gate groove respectively by using a process of depositing and then etching-back a conductive layer, as shown in FIG. 1a; next, covering the control gates 105 to form insulating film dielectric layers 201 by using a process of depositing and then etching-back an insulating film, and etching the substrate epitaxial layer along the edges of the insulating film dielectric layers 201 to form a split-gate groove, as shown in FIG. 1b.

The existing typical method for manufacturing a split-gate power device has the following problems. Firstly, the lateral width of the control gates 105 is small, so that the difficulty in etching of control gate contact holes is increased; and secondly, in the process of forming the insulating film dielectric layers 201 by using an etching-back method, parts of the insulating film dielectric layers above the control gates 105 are easily etched, so that the control gates 105 are hard to protect. Thus, the manufacturing process of the split-gate power device is hard to control, and the yield is low.

SUMMARY OF THE INVENTION

Technical Problem

An objective of the present invention is to provide a method for manufacturing a split-gate power device in order to solve the defects in the prior art, and the present invention can ensure that the manufacturing process of the split-gate power device is stable, reliable and easy to control and has a high yield.

Technical Solution

A method 1 for manufacturing a split-gate power device according to the present invention includes the following basic steps:

Step 1: forming a first insulating film on a substrate epitaxial layer of a first doping type, performing first photoetching, and etching the first insulating film to form an opening of the first insulating film in the first insulating film;

Step 2: etching the substrate epitaxial layer by using the first insulating film as a mask to form a control gate groove in the substrate epitaxial layer, two side edges of the control gate groove extending below the first insulating film at two sides of the opening of the first insulating film to form lateral recesses below the first insulating film;

Step 3: forming a second insulating film on the surface of the control gate groove, and depositing a first conductive film, the first conductive film at least filling the lateral recesses at the two sides of the control gate groove and below the first insulating film;

Step 4: etching away a part of the first conductive film above the first insulating film, and further etching the first conductive film along the edge of the opening of the first insulating film to form control gates at the two sides of the control gate groove;

Step 5: etching the exposed second insulating film, depositing and etching-back a third insulating film to form third insulating film dielectric layers on side walls of the control gates, and etching the substrate epitaxial layer along the edges of the third insulating film dielectric layers to form a split-gate groove;

Step 6: forming a fourth insulating film on the surface of the split-gate groove;

Step 7: etching the third insulating film dielectric layers, and forming a fifth insulating film on the exposed surfaces of the control gates;

Step 8: depositing and etching-back a second conductive film to form a split-gate in the split-gate groove, the surface of the split-gate being slightly lower than the surface of the substrate epitaxial layer;

Step 9: etching the first insulating film, performing ion implantation of a second doping type to form a channel region in the substrate epitaxial layer, and performing second photoetching and ion implantation of the first doping type to form a source region in the substrate epitaxial layer;

Step 10: depositing a sixth insulating film and performing third photoetching to form contact hole patterns, etching the sixth insulating film to form contact holes, and performing ion implantation of the second doping type and depositing a metal layer to form ohmic contact; and Step 11: performing fourth photoetching, and etching the metal layer to respectively form a source electrode, a control gate electrode, and a split-gate electrode.

Further, in a preferred solution of the method 1 for manufacturing a split-gate power device according to the present invention:

the material of the first insulating film is silicon oxide or silicon nitride;

the material of the third insulating film is silicon nitride;

the materials of the second insulating film, the fourth insulating film, and the fifth insulating film are all silicon oxide;

the material of the sixth insulating film is silicate glass, boro-phospho-silicate glass, or phospho-silicate glass;

the control gate is a polysilicon gate or metal gate;

the material of the second conductive film is polysilicon;

the first doping type is n-type doping, and the second doping type is p-type doping;

the first doping type is p-type doping, and the second doping type is n-type doping.

A method 2 for manufacturing a split-gate power device according to the present invention includes the following basic steps:

Step 1: forming a first insulating film on a substrate epitaxial layer of a first doping type, performing first photoetching, and etching the first insulating film to form an opening of the first insulating film in the first insulating film;

Step 2: etching the substrate epitaxial layer by using the first insulating film as a mask to form a control gate groove in the substrate epitaxial layer, two side edges of the control gate groove extending below the first insulating film at two sides of the opening of the first insulating film to form lateral recesses below the first insulating film;

Step 3: forming a second insulating film on the surface of the control gate groove, and depositing a first conductive film, the first conductive film at least filling the lateral recesses at the two sides of the control gate groove and below the first insulating film;

Step 4: etching away a part of the first conductive film above the first insulating film, and further etching the first conductive film along the edge of the opening of the first insulating film to form control gates at the two sides of the control gate groove;

Step 5: etching the exposed second insulating film, and further etching the substrate epitaxial layer by using the first insulating film as a mask to form a split-gate groove in the substrate epitaxial layer;

Step 6: forming a third insulating film on the surfaces of the control gates and the surface of the split-gate groove;

Step 7: depositing and etching-back a second conductive film to form a split-gate in the split-gate groove, the surface of the split-gate being slightly lower than the surface of the substrate epitaxial layer;

Step 8: respectively etching the third insulating film and the first insulating film, and performing ion implantation of a second doping type to form a channel region in the substrate epitaxial layer;

Step 9: performing second photoetching and ion implantation of the first doping type to form a source region in the substrate epitaxial layer;

Step 10: depositing a fourth insulating film and performing third photoetching, etching the fourth insulating film to form contact holes, and performing ion implantation of the second doping type and depositing a metal layer to form ohmic contact; and Step 11: performing fourth photoetching, and etching the metal layer to respectively form a source electrode, a control gate electrode, and a split-gate electrode.

Further, in a preferred solution of the method 2 for manufacturing a split-gate power device according to the present invention:

the material of the first insulating film is silicon oxide or silicon nitride;

the material of the second insulating film is silicon oxide;

the material of the third insulating film is silicon oxide, and the thickness of the third insulating film ranges from 200 nm to 1000 nm;

the material of the fourth insulating film is silicate glass, boro-phospho-silicate glass, or phospho-silicate glass;

the control gate is a polysilicon gate or metal gate;

the material of the second conductive film is polysilicon;

the first doping type is n-type doping, and the second doping type is p-type doping;

the first doping type is p-type doping, and the second doping type is n-type doping.

Advantageous Effect

Compared with the prior art, the present invention has the following significant advantages.

The method 1 for manufacturing a split-gate power device according to the present invention is a first solution suitable for a trench-type split-gate power device, wherein lateral etching is added to form lateral recess parts of a control gate groove below a first insulating film in a process of forming the control gate groove by etching, and therefore, after a first conductive film is deposited, the first conductive film can be directly etched by using the first insulating film as a mask to form control gates. The whole technical process is simplified, reliable and easy to control, and can greatly improve the yield of the trench-type power device.

The method 2 for manufacturing a split-gate power device according to the present invention is a second solution suitable for a trench-type split-gate power device, wherein after control gates are formed by etching, a substrate epitaxial layer is directly etched by using a first insulating film as a mask to form a split-gate groove, and during the etching process, the control gates are partially etched, so that the width of the control gates is reduced, leading to higher requirements on the etching precision of control gate electrode contact holes; after the split-gate groove is formed, a thick layer of a third insulating film is directly deposited to cover the surfaces of the control gates and the surface of the split-gate groove, thereby reducing the impact caused by alignment deviation of the control gate electrode contact holes, and lowering the requirements on the etching precision of the control gate electrode contact holes. The whole technical process is simplified, reliable and easy to control, and can greatly improve the yield of the split-gate power device.

The method 1 and the method 2 for manufacturing a split-gate power device according to the present invention are particularly suitable for the manufacture of 25V-200V semiconductor power devices.

DETAILED DESCRIPTION OF THE INVENTION

Figure 1A:
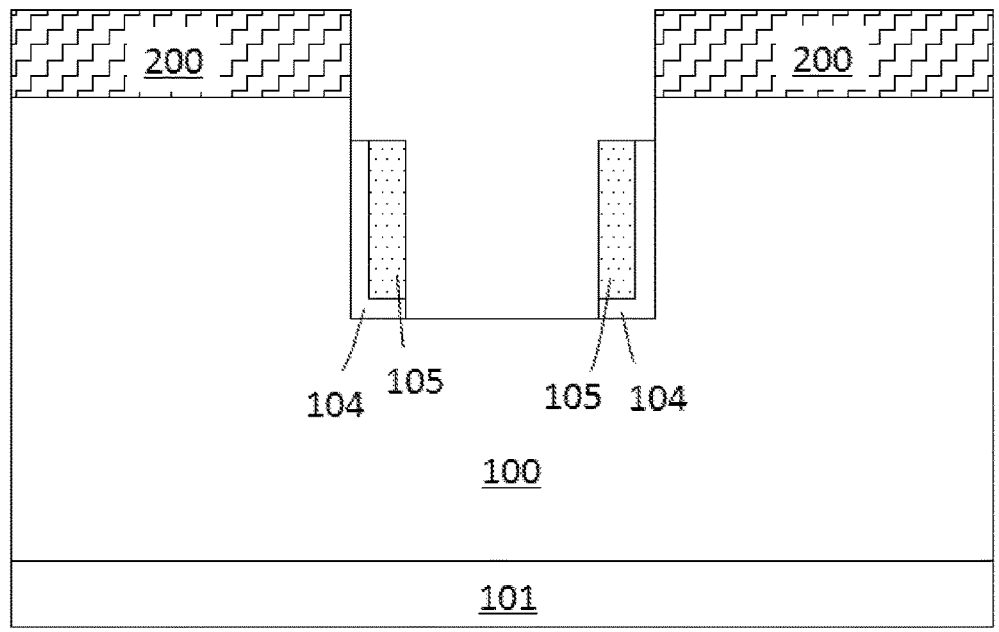
FIG. 1a and FIG. 1b are schematic flowcharts illustrating a partial process of a method for manufacturing a trench-type split-gate power device in the prior art.
Figure 1B:
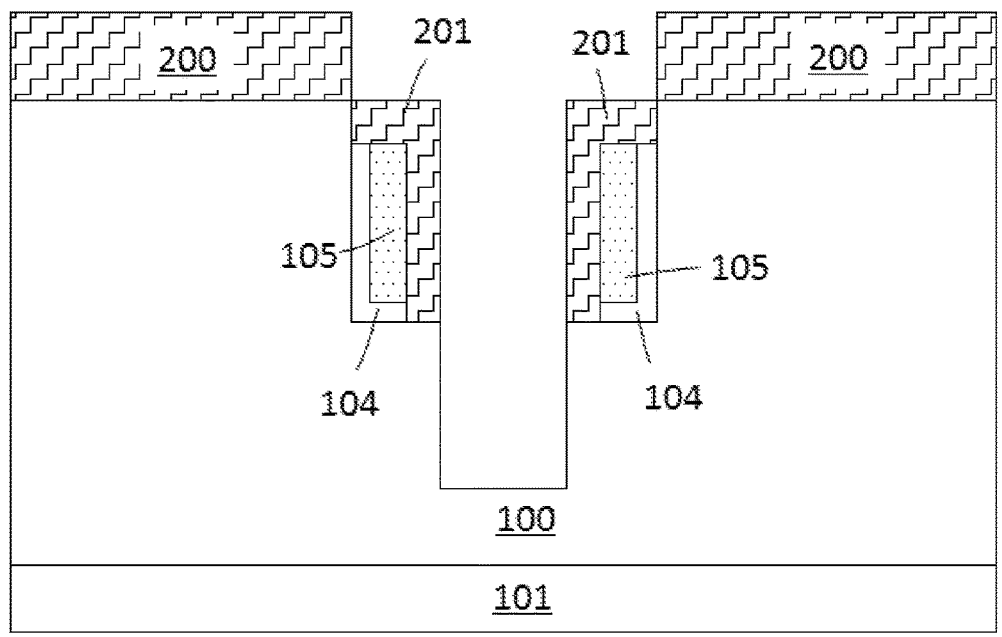

A detailed description of the present invention will be further given below in detail with reference to the accompanying drawings and embodiments.

For ease of description, the thickness of layers and regions is amplified in the drawings, and the depicted sizes are not the actual sizes. Although the drawings do not completely accurately reflect the actual sizes of a device, they give a complete reflection of the relative positions of the regions and the constituting structures, particularly the up-and-down and adjacency relationships between the constituting structures. The following embodiments of the present invention shall not be considered as being limited to the specific shapes of the regions shown in the drawings, but include the obtained shapes, such as variations due to the manufacture.

FIG. 2 to FIG. 10 illustrate a technical process of an embodiment of a method 1 for manufacturing a split-gate power device according to the present invention. The process includes the following specific steps.

Figure 2:
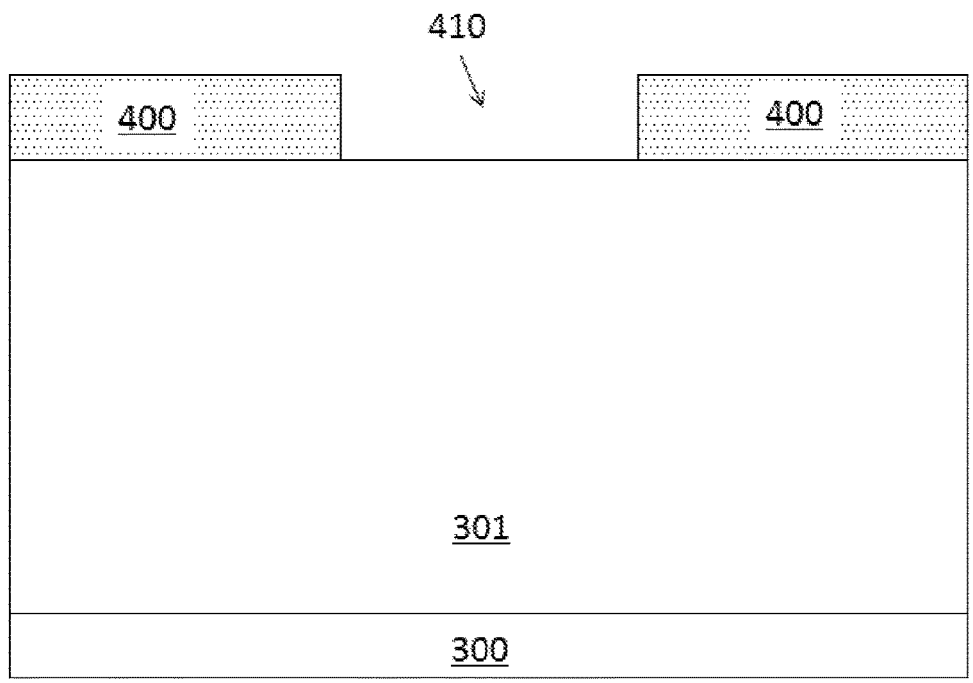
FIG. 2 to FIG. 10 are schematic flowcharts illustrating a process of an embodiment of a method 1 for manufacturing a split-gate power device according to the present invention.

Firstly, as shown in FIG. 2, a substrate epitaxial layer 301 of a first doping type is formed above a drain region 300 of the first doping type, a first insulating film 400 is formed above the substrate epitaxial layer 301, a first photoetching process is performed to define the position of a control gate groove, and the first insulating film 400 is etched to form an opening 410 of the first insulating film in the first insulating film 400.

The material of the first insulating film 400 may be silicon oxide or silicon nitride, and may also be a stacked layer of silicon oxide and silicon nitride, for example, an insulating film of an ONO structure, including a first oxide layer, a second nitride layer, and a third oxide layer that are sequentially stacked.

Figure 3:
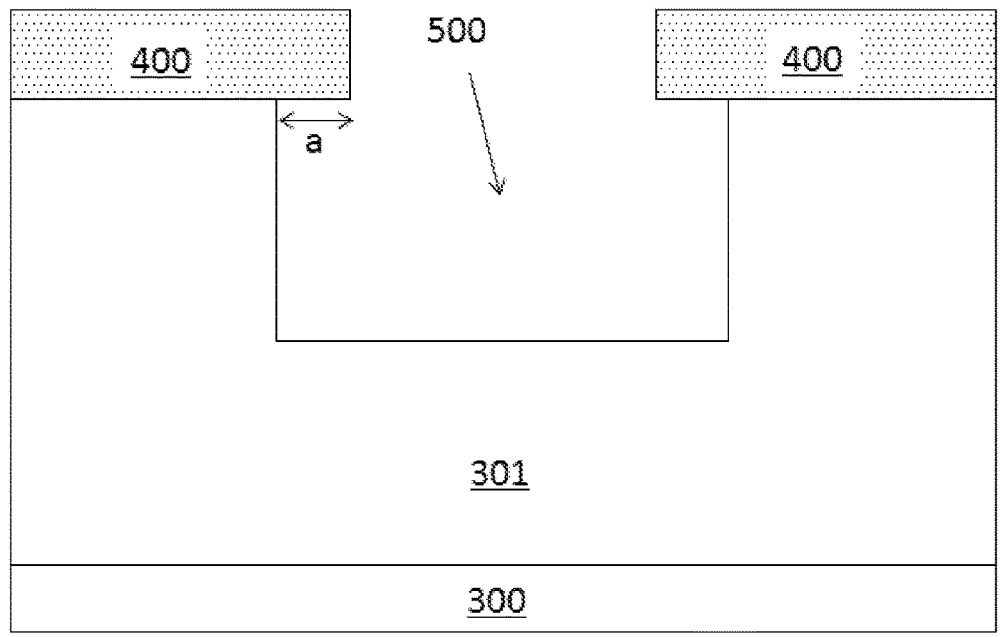

Next, as shown in FIG. 3, the substrate epitaxial layer 301 is etched by using the first insulating film 400 as a mask to form a control gate groove 500 in the substrate epitaxial layer 301. In the etching process of this step, lateral etching may be added to form lateral recesses of the control gate groove 500 below the first insulating film 400, the lateral width of the lateral recess being a.

Figure 4:
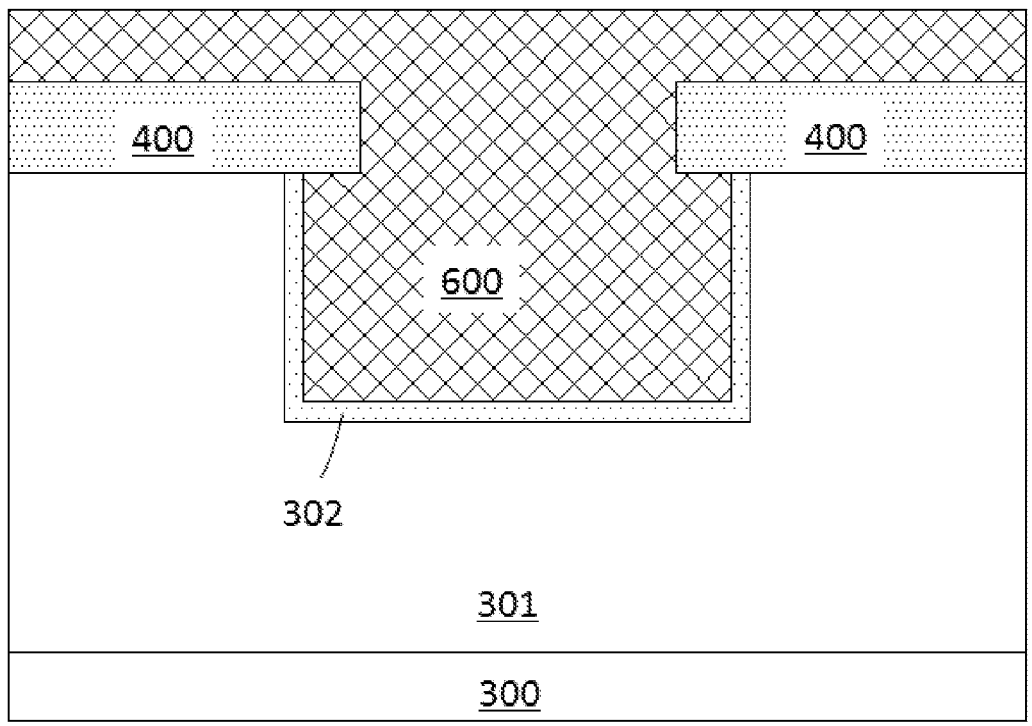

Then, as shown in FIG. 4, a second insulating film 302 is formed on the surface of the control gate groove, and a first conductive film 600 is deposited, the first conductive film 600 at least filling the lateral recesses at the two sides of the control gate groove 500 and below the first insulating film 400. In the present embodiment, the first conductive film 600 fills the control gate groove 500.

The material of the second insulating film 302 is preferably silicon oxide, and the material of the first conductive film 600 is polysilicon or metal.

Figure 5:
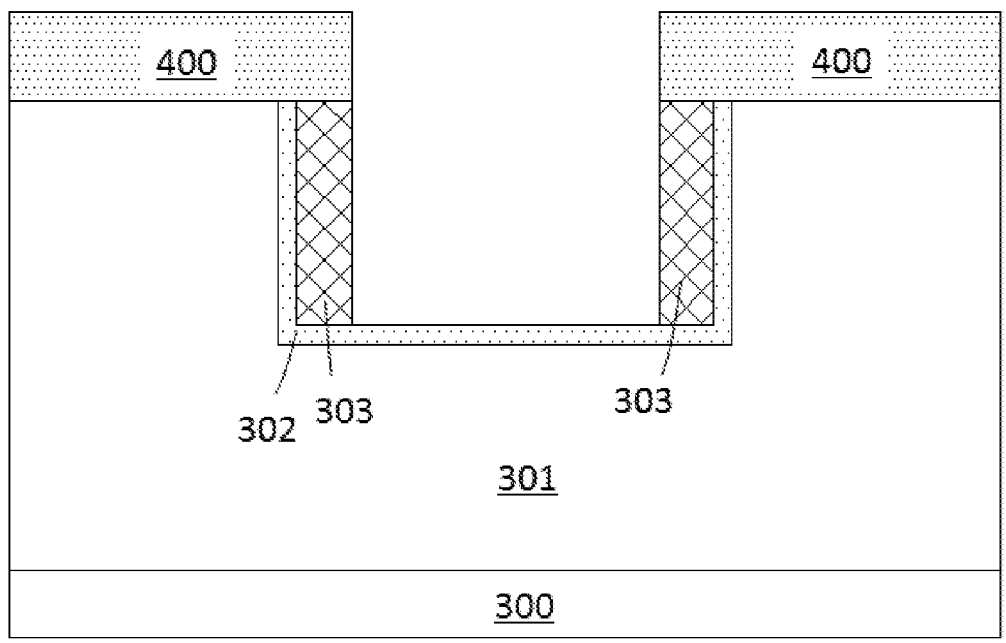

Next, as shown in FIG. 5, a part of the first conductive film 600 above the first insulating film 400 is etched away, and the first conductive film 600 is further etched along the edge of the opening 410 of the first insulating film to form control gates 303 with a lateral width of a at the two sides of the control gate groove, wherein the lateral width a of the control gates 303 should satisfy the requirement for subsequent formation of control gate contact holes, and if the lateral width a of the control gates 303 is too small, the formation of the control gate contact holes may be affected.

Figure 6:
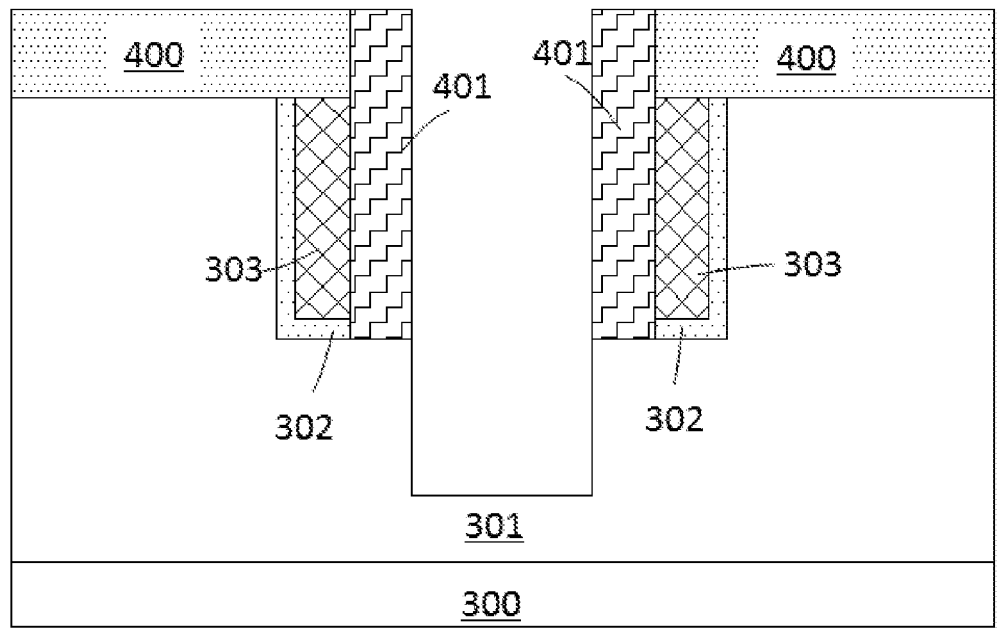

As shown in FIG. 6, the exposed second insulating film 302 is etched away, a third insulating film is deposited and etched-back to form third insulating film dielectric layers 401 on exposed side walls of the control gates 303, and the substrate epitaxial layer 301 is etched along the edges of the third insulating film dielectric layers 401 to form a split-gate groove, the material of the third insulating film dielectric layer 401 being preferably silicon nitride.

In the above step, the split-gate groove is formed by self-aligned etching of the substrate epitaxial layer 301 using the third insulating film dielectric layers 401 as a mask, and because the etching of the control gate groove and the split-gate groove only uses one mask plate for etching the control gate groove, the complexity and cost of device processing are reduced.

Figure 7:
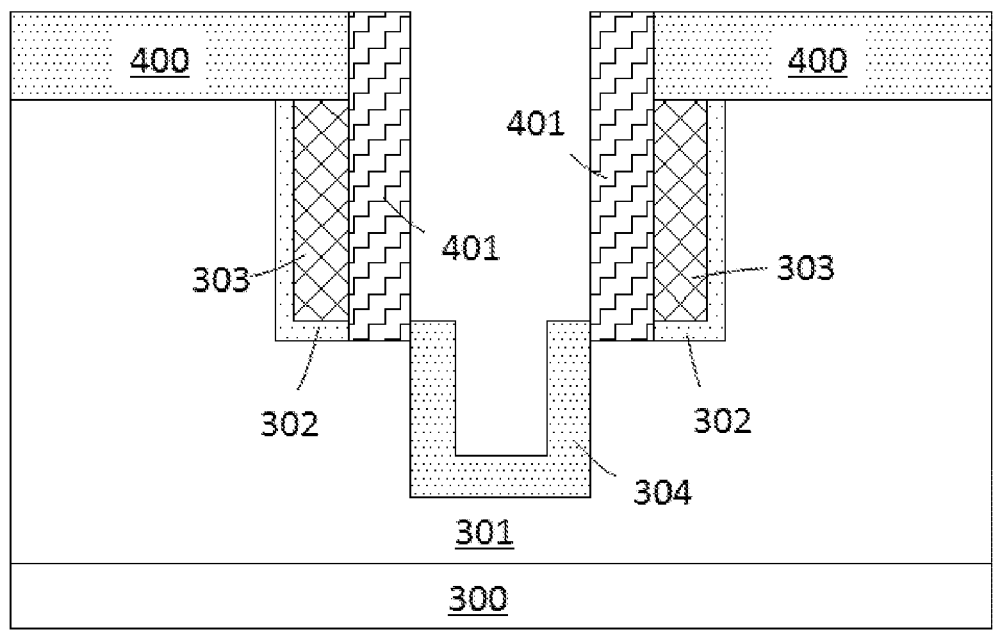
Figure 8:
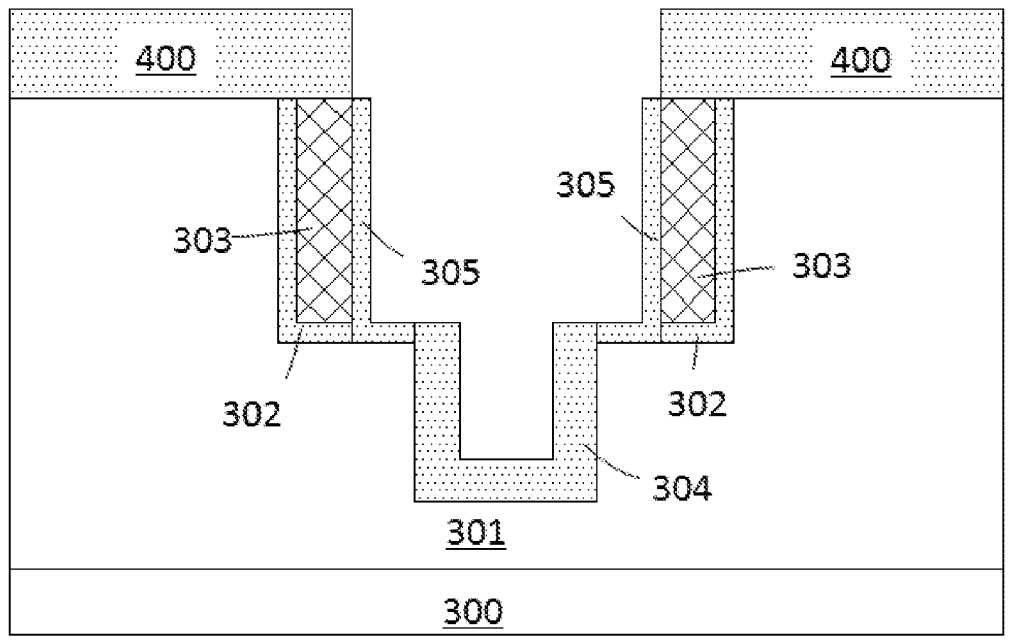

Next, as shown in FIG. 7, a fourth insulating film 304 is formed on the surface of the split-gate groove, the material of the fourth insulating film 304 being preferably silicon oxide. Then, as shown in FIG. 8, the third insulating film dielectric layers 401 are etched away, and a fifth insulating film 305 is formed on the exposed surfaces of the control gates 303, the material of the fifth insulating film 305 being preferably silicon oxide.

Figure 9:
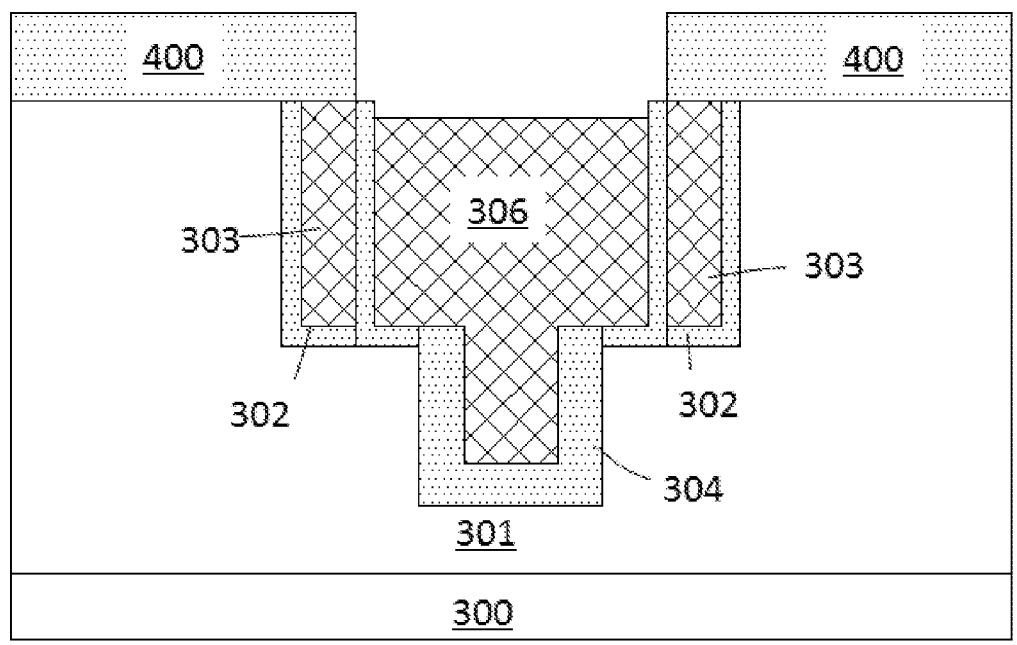

Then, as shown in FIG. 9, a second conductive film is deposited to cover the formed structure and is etched-back to form a split-gate 306 in the split-gate groove, the surface of the split-gate 306 being slightly lower than the surface of the substrate epitaxial layer 301, and the material of the split-gate 306 being preferably doped polysilicon.

Figure 10:
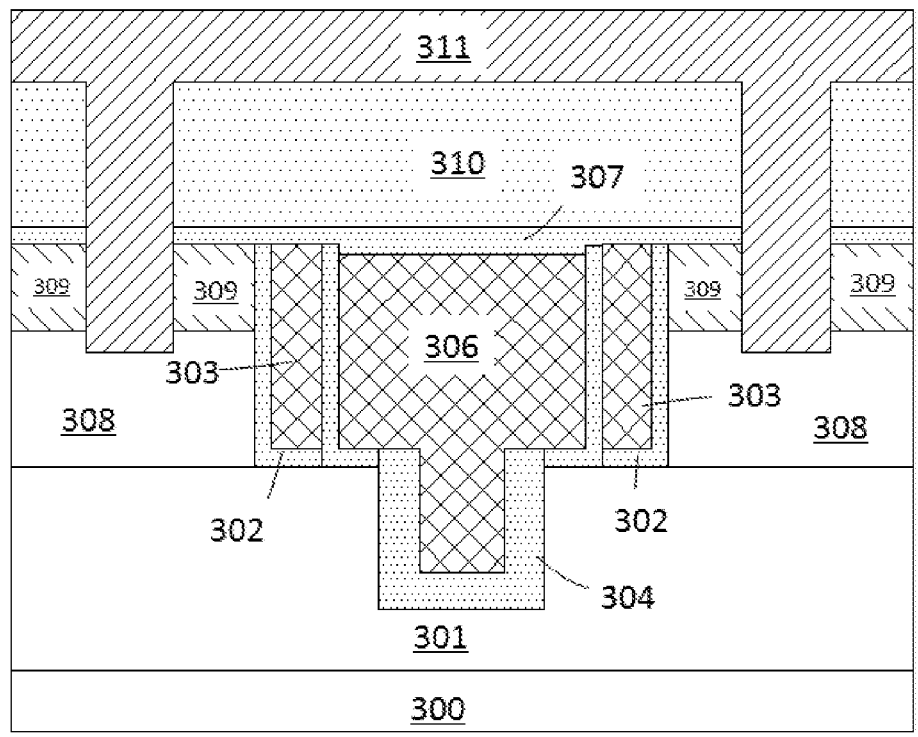

Next, as shown in FIG. 10, the first insulating film 400 is etched away, and a thin oxide layer 307 is formed by oxidization for restoring the surface of the substrate epitaxial layer 301; ion implantation of a second doping type is performed to form a channel region 308 in the substrate epitaxial layer 301, the bottom of the channel region 308 being preferably at the bottom position of the control gate groove; a second photoetching process is performed to define the position of a source region; ion implantation of the first doping type is performed to form a source region 309 in the substrate epitaxial layer 301; a sixth insulating film 310 is deposited to cover the formed structure, a third photoetching process is performed to form contact hole patterns, and the sixth insulating film 310 is etched to form contact holes; and finally ion implantation of the second doping type is performed and a metal layer 311 is deposited to form ohmic contact. The material of the sixth insulating film 310 is silicate glass, boro-phospho-silicate glass, or phospho-silicate glass.

The second doping type and the first doping type in the present invention are opposite doping types, that is, if the first doping type is n-type doping, the second doping type is p-type doping; or if the first doping type is p-type doping, the second doping type is n-type doping.

Finally, fourth photoetching is performed, and the metal layer is etched to respectively form a source electrode, a control gate electrode, and a split-gate electrode.

Preferably, the drain region 300 may be formed in the substrate epitaxial layer 301 by ion implantation after the source electrode, the control gate electrode, and the split-gate electrode are formed, and then a metal layer is deposited to form a drain electrode.

FIG. 11 to FIG. 15 illustrate a technical process of an embodiment of a method 2 for manufacturing a split-gate power device according to the present invention. The process includes the following specific steps.

Figure 11:
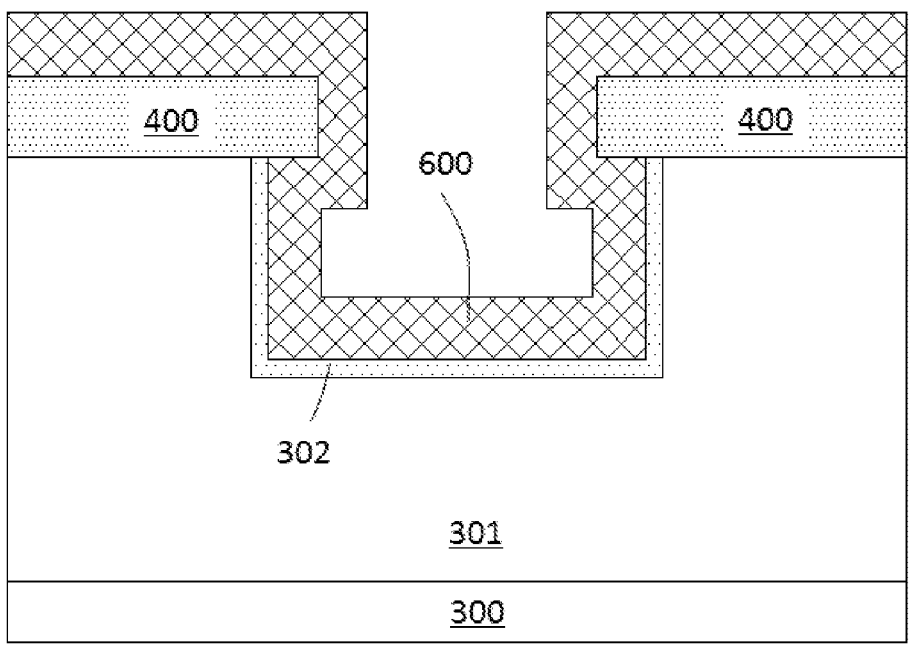
FIG. 11 to FIG. 15 are schematic flowcharts illustrating a process of an embodiment of a method 2 for manufacturing a split-gate power device according to the present invention.

Firstly, according to the processes shown in FIG. 2 and FIG. 3, a control gate groove 500 is formed in a substrate epitaxial layer 301, a second insulating film 302 is formed on the surface of the control gate groove, and a first conductive film 600 is deposited to cover the formed structure, the first conductive film 600 at least filling lateral recesses at two sides of the control gate groove 500 and below a first insulating film 400, as shown in FIG. 11.

The material of the second insulating film 302 is preferably silicon oxide, and the thickness of the second insulating film 302 ranges from 10 nm to 50 nm. The material of the first conductive film 600 is polysilicon or metal.

Figure 12:
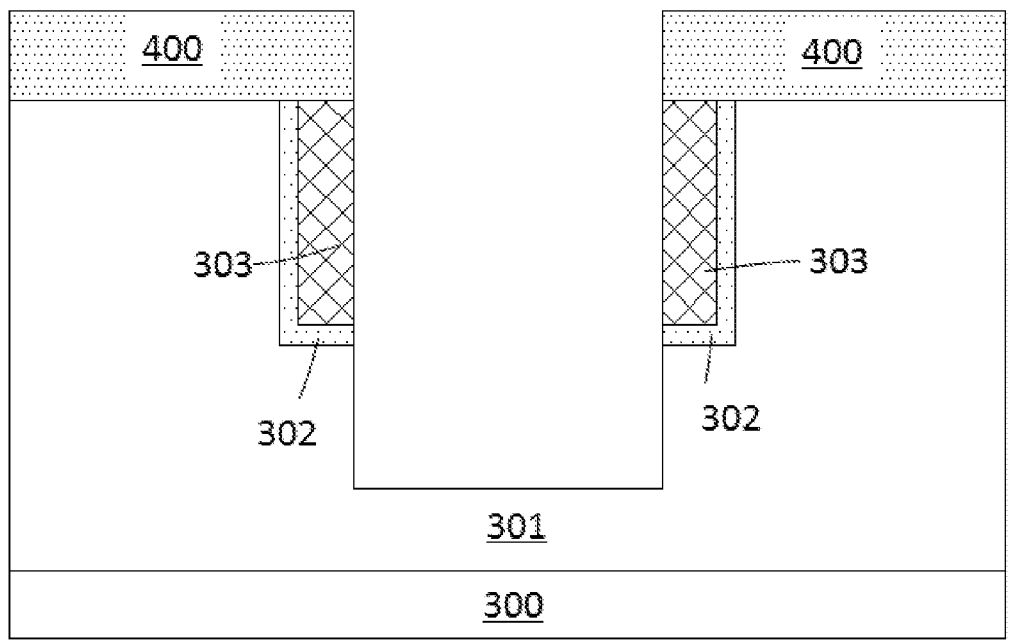

Next, as shown in FIG. 12, a part of the first conductive film 600 above the first insulating film 400 is etched away, and the first conductive film 600 is further etched along the edge of an opening 410 of the first insulating film to form control gates 303 with a lateral width of a at the two sides of the control gate groove, the exposed second insulating film 302 is etched, and the substrate epitaxial layer 301 is etched along the edges of the control gates 303 by using the first insulating film 400 as a mask to form a split-gate groove.

Figure 13:
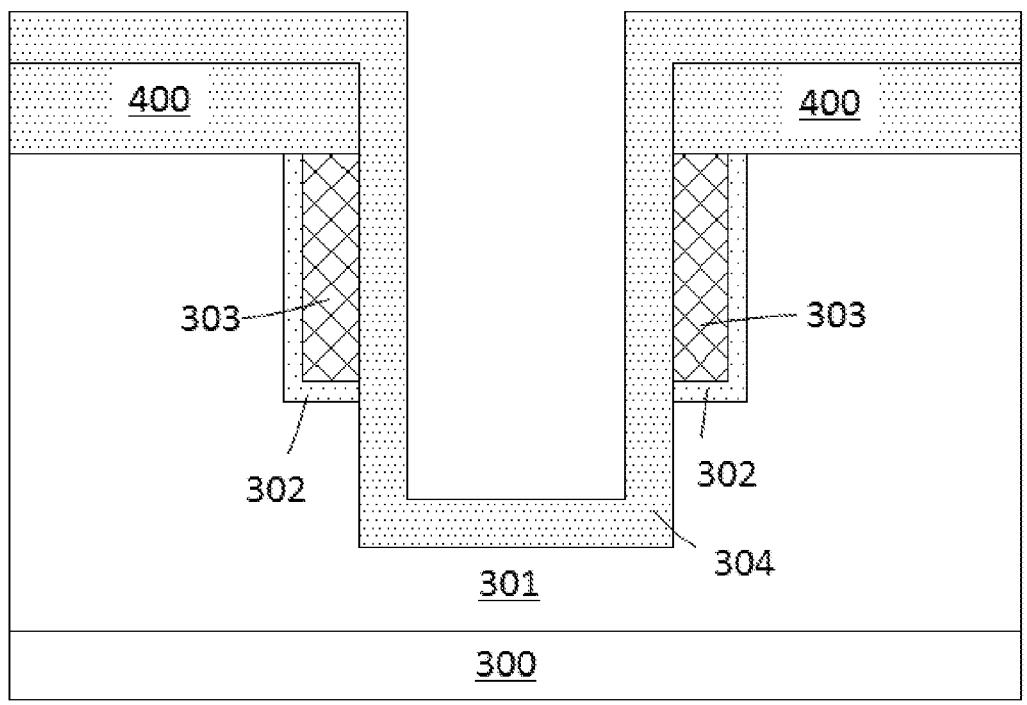

Then, as shown in FIG. 13, a third insulating film 304 is deposited, and the third insulating film 304 covers the surfaces of the control gates 303 and the surface of the split-gate groove. The material of the third insulating film 304 is preferably silicon oxide. The thickness of the third insulating film 304 shall be not smaller than half of the width of the split-gate groove, and is preferably 200 nm to 1000 nm.

Figure 14:
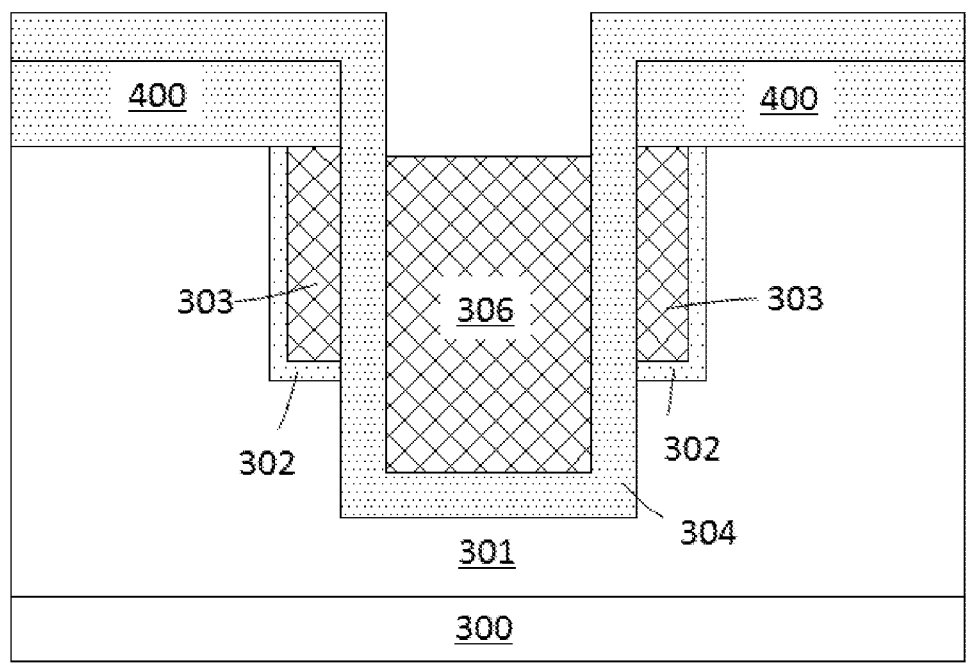

Next, as shown in FIG. 14, a second conductive film is deposited to cover the formed structure and is etched-back to form a split-gate 306 in the split-gate groove, the surface position of the split-gate 306 being slightly lower than the surface position of the substrate epitaxial layer 301, and the material of the split-gate 306 being preferably doped polysilicon.

Figure 15A:
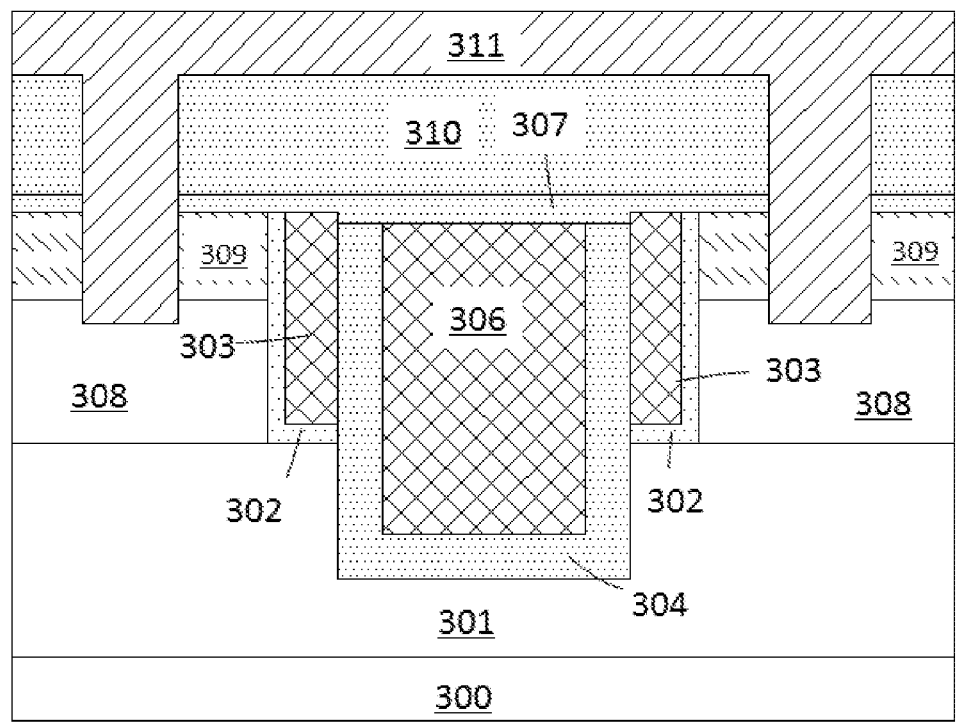
Figure 15B:
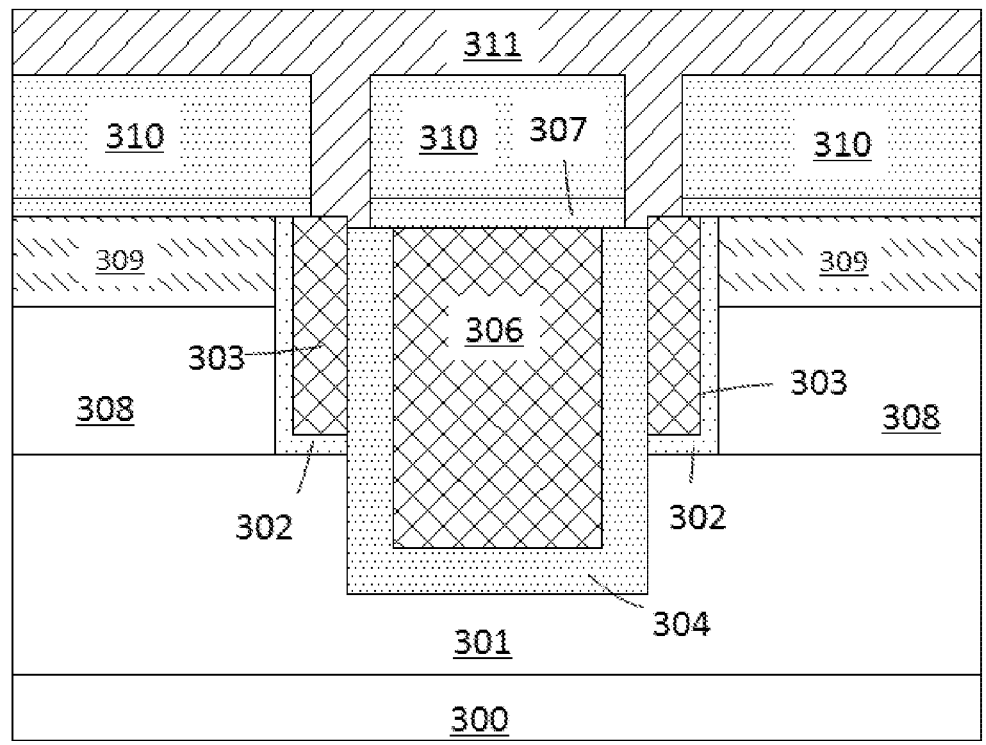

Finally, as shown in FIG. 15a and FIG. 15b, the exposed third insulating film 304 and the first insulating film 400 are etched away, and a thin oxide layer 307 is formed by oxidization for restoring the surface of the substrate epitaxial layer 301; ion implantation of a second doping type is performed to form a channel region 308 in the substrate epitaxial layer 301, the bottom of the channel region 308 being preferably at the bottom position of the control gate groove; a second photoetching process is performed to define the position of a source region; ion implantation of a first doping type is performed to form a source region 309 in the substrate epitaxial layer 301; a fourth insulating film 310 is deposited to cover the formed structure, the material of the fourth insulating film 310 being silicate glass, boro-phospho-silicate glass, or phospho-silicate glass; a third photoetching process is performed to form contact hole patterns, and the fourth insulating film 310 is etched to form contact holes; and then ion implantation of the second doping type is performed and a metal layer 311 is deposited to form ohmic contact.

FIG. 15a illustrates an ohmic contact structure at source electrode contact holes, and FIG. 15b illustrates an ohmic contact structure at control gate electrode contact holes. The fourth insulating film 304 between the split-gate and the control gates of the split-gate power device obtained by the present invention is thick, and even if the control gate electrode contact holes are located on the fourth insulating film 304 due to alignment deviation, the device reliability is not be affected, and therefore, the impact on device reliability caused by alignment deviation of the control gate electrode contact holes is reduced, and the process difficulty is lowered.

The contents not specifically described in the specific embodiments of the present invention are known in the art and may be implemented with reference to known techniques.

The present invention has been verified via repeated tests, and satisfactory test results are achieved.

The embodiments mentioned in the detailed description above are provided to support the technical concept of the method for manufacturing a split-gate power device according to the present invention, and are not intended to limit the scope of protection of the present invention. Any equivalent modification or variations made based on the present technical solution following the technical concepts of the present invention, all fall within the scope of protection of the present invention.

What is claimed is:

1. A method for manufacturing a split-gate power device, comprising the following basic steps:

Step 1: forming a first insulating film on a substrate epitaxial layer of a first doping type, performing first photoetching, and etching the first insulating film to form an opening of the first insulating film in the first insulating film;

Step 2: etching the substrate epitaxial layer by using the first insulating film as a mask to form a control gate groove in the substrate epitaxial layer, two side edges of the control gate groove extending below the first insulating film at two sides of the opening of the first insulating film to form lateral recesses below the first insulating film;

Step 3: forming a second insulating film on the surface of the control gate groove, and depositing a first conductive film, the first conductive film at least filling the lateral recesses at the two sides of the control gate groove and below the first insulating film;

Step 4: etching away a part of the first conductive film above the first insulating film, and further etching the first conductive film along the edge of the opening of the first insulating film to form control gates at the two sides of the control gate groove;

Step 5: etching the exposed second insulating film, depositing and etching-back a third insulating film to form third insulating film dielectric layers on side walls of the control gates, and etching the substrate epitaxial layer along the edges of the third insulating film dielectric layers to form a split-gate groove;

Step 6: forming a fourth insulating film on the surface of the split-gate groove;

Step 7: etching the third insulating film dielectric layers, and forming a fifth insulating film on the exposed surfaces of the control gates;

Step 8: depositing and etching-back a second conductive film to form a split-gate in the split-gate groove, the surface of the split-gate being slightly lower than the surface of the substrate epitaxial layer;

Step 9: etching the first insulating film, performing ion implantation of a second doping type to form a channel region in the substrate epitaxial layer, and performing second photoetching and ion implantation of the first doping type to form a source region in the substrate epitaxial layer;

Step 10: depositing a sixth insulating film and performing third photoetching to form contact hole patterns, etching the sixth insulating film to form contact holes, and performing ion implantation of the second doping type and depositing a metal layer to form ohmic contact; and Step 11: performing fourth photoetching, and etching the metal layer to respectively form a source electrode, a control gate electrode, and a split-gate electrode.

2. The method for manufacturing a split-gate power device according to claim 1, wherein the material of the first insulating film is silicon oxide or silicon nitride.

3. The method for manufacturing a split-gate power device according to claim 1, wherein the material of the third insulating film is silicon nitride.

4. The method for manufacturing a split-gate power device according to claim 1, wherein the materials of the second insulating film, the fourth insulating film, and the fifth insulating film are all silicon oxide.

5. The method for manufacturing a split-gate power device according to claim 1, wherein the material of the sixth insulating film is silicate glass, boro-phospho-silicate glass, or phospho-silicate glass.

6. The method for manufacturing a split-gate power device according to claim 1, wherein the control gate is a polysilicon gate or metal gate.

7. The method for manufacturing a split-gate power device according to claim 1, wherein the material of the second conductive film is polysilicon.

8. The method for manufacturing a split-gate power device according to claim 1, wherein the first doping type is n-type doping, and the second doping type is p-type doping.

9. The method for manufacturing a split-gate power device according to claim 1, wherein the first doping type is p-type doping, and the second doping type is n-type doping.

10. A method for manufacturing a split-gate power device, comprising the following basic steps:
  Step 1: forming a first insulating film on a substrate epitaxial layer of a first doping type, performing first photoetching, and etching the first insulating film to form an opening of the first insulating film in the first insulating film;
  Step 2: etching the substrate epitaxial layer by using the first insulating film as a mask to form a control gate groove in the substrate epitaxial layer, two side edges of the control gate groove extending below the first insulating film at two sides of the opening of the first insulating film to form lateral recesses below the first insulating film;
  Step 3: forming a second insulating film on the surface of the control gate groove, and depositing a first conductive film, the first conductive film at least filling the lateral recesses at the two sides of the control gate groove and below the first insulating film;
  Step 4: etching away a part of the first conductive film above the first insulating film, and further etching the first conductive film along the edge of the opening of the first insulating film to form control gates at the two sides of the control gate groove;
  Step 5: etching the exposed second insulating film, and further etching the substrate epitaxial layer by using the first insulating film as a mask to form a split-gate groove in the substrate epitaxial layer;
  Step 6: forming a third insulating film on the surfaces of the control gates and the surface of the split-gate groove;
  Step 7: depositing and etching-back a second conductive film to form a split-gate in the split-gate groove, the surface of the split-gate being slightly lower than the surface of the substrate epitaxial layer;
  Step 8: respectively etching the third insulating film and the first insulating film, and performing ion implantation of a second doping type to form a channel region in the substrate epitaxial layer;
  Step 9: performing second photoetching and ion implantation of the first doping type to form a source region in the substrate epitaxial layer;
  Step 10: depositing a fourth insulating film and performing third photoetching, etching the fourth insulating film to form contact holes, and performing ion implantation of the second doping type and depositing a metal layer to form ohmic contact; and
  Step 11: performing fourth photoetching, and etching the metal layer to respectively form a source electrode, a control gate electrode, and a split-gate electrode.

11. The method for manufacturing a split-gate power device according to claim 10, wherein the material of the first insulating film is silicon oxide or silicon nitride.

12. The method for manufacturing a split-gate power device according to claim 10, wherein the material of the second insulating film is silicon oxide.

13. The method for manufacturing a split-gate power device according to claim 10, wherein the material of the third insulating film is silicon oxide, and the thickness of the third insulating film ranges from 200 nm to 1000 nm.

14. The method for manufacturing a split-gate power device according to claim 10, wherein the material of the fourth insulating film is silicate glass, boro-phospho-silicate glass, or phospho-silicate glass.

15. The method for manufacturing a split-gate power device according to claim 10, wherein the control gate is a polysilicon gate or metal gate.

16. The method for manufacturing a split-gate power device according to claim 10, wherein the material of the second conductive film is polysilicon.

17. The method for manufacturing a split-gate power device according to claim 10, wherein the first doping type is n-type doping, and the second doping type is p-type doping.

18. The method for manufacturing a split-gate power device according to claim 10, wherein the first doping type is p-type doping, and the second doping type is n-type doping.

* * * * *